United States Patent
Oljaca et al.

(10) Patent No.: US 9,954,422 B2
(45) Date of Patent: Apr. 24, 2018

(54) INTEGRATED GATE DRIVER FOR MOTOR CONTROL

(71) Applicant: Texas Instruments Incorporated, Dallas, TX (US)

(72) Inventors: Miroslav Oljaca, Allen, TX (US); Ajinder Singh, Murphy, TX (US); Sanjay Pithadia, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/355,533

(22) Filed: Nov. 18, 2016

(65) Prior Publication Data

US 2017/0288511 A1    Oct. 5, 2017

Related U.S. Application Data

(60) Provisional application No. 62/315,145, filed on Mar. 30, 2016.

(51) Int. Cl.
*H02P 1/30* (2006.01)
*G05F 1/10* (2006.01)
(Continued)

(52) U.S. Cl.
CPC ........... *H02K 11/33* (2016.01); *H02M 3/07* (2013.01); *H02P 27/08* (2013.01); *H03K 17/567* (2013.01); *H02M 1/08* (2013.01)

(58) Field of Classification Search
None
See application file for complete search history.

(56) References Cited

U.S. PATENT DOCUMENTS

| | | | |
|---|---|---|---|
| 2010/0289560 A1* | 11/2010 | Mavencamp | H02M 1/08 327/538 |
| 2011/0068723 A1 | 3/2011 | Maiocchi | |
| 2014/0300987 A1 | 10/2014 | Otaguro | |

FOREIGN PATENT DOCUMENTS

EP    1541422 A1    6/2005

OTHER PUBLICATIONS

Data Sheet for DRV8301, "DRV8301 Three-Phase Gate Driver With Dual Current Shunt Amplifiers and Buck Regulator"; Texas Instruments, Jan. 2016, pp. 1-39.

(Continued)

*Primary Examiner* — Bentsu Ro
*Assistant Examiner* — Zemenay Truneh
(74) *Attorney, Agent, or Firm* — John R. Pessetto; Charles A. Brill; Frank D. Cimino

(57) ABSTRACT

An integrated gate driver for motor control includes a first diode coupled to an upper rail and providing a voltage on a first connector and a power amplifier coupled between the first connector and a second connector that can be coupled to a source of a high-side power transistor. The power amplifier receives a control signal and provides an output signal to a second pin for driving a gate of the high-side power transistor. A first integrated capacitor is coupled between the first and second connector and an integrated charge pump is coupled to supply a current to the first connector. The charge pump includes a second integrated capacitor having a terminal coupled to a high frequency oscillator and a terminal coupled through a second diode to the first connector and a third diode coupled between the second connector and a point between the second capacitor and the second diode.

5 Claims, 3 Drawing Sheets

(51) Int. Cl.
*H02K 11/33* (2016.01)
*H02P 27/08* (2006.01)
*H03K 17/567* (2006.01)
*H02M 3/07* (2006.01)
*H02M 1/08* (2006.01)

(56) References Cited

OTHER PUBLICATIONS

International Search Report for PCT/US2017/025107 dated Jul. 13, 2017.

* cited by examiner

INTEGRATED GATE DRIVER FOR MOTOR CONTROL

CLAIM OF PRIORITY AND RELATED PATENT APPLICATIONS

This nonprovisional application claims priority based upon the following prior U.S. provisional patent application(s): (i) "Integrated Non-Isolated Gate Driver for Motor Control," Application No.: 62/315,145, filed Mar. 30, 2016, in the name(s) of Miroslav Oljaca, Ajinder Singh, and Sanjay Pithadia; which is hereby incorporated by reference in its entirety.

FIELD OF THE DISCLOSURE

Disclosed embodiments relate generally to the field of motor control systems. More particularly, and not by way of any limitation, the present disclosure is directed to an integrated gate driver for motor control.

BACKGROUND

In motor control applications when low cost is a key design factor, bootstrap circuits are used to power a high side gate driver. Leakage current through the high side gate driver and the size of the bootstrap capacitor will limit the length of the high voltage applied to the motor. This complicates a control algorithm, especially in brushless direct current (BLDC) motors and space vector pulse width modulation, by limiting low speed operation and zero speed torque that can be applied to the motor. Accordingly, advanced control algorithms are utilized in these applications. Simpler control algorithms are desirable.

SUMMARY

Disclosed embodiments combine an integrated bootstrap circuit and an integrated charge pump in one integrated circuit (IC) for driving the gate of power transistors used for motor control. The integrated charge pump is provided to replace the voltage lost due to quiescent current through the high-side amplifier circuit. The combination of bootstrap circuit and charge pump increases performance of the system, simplifies control algorithms, and minimizes the size of the components used in the circuit. The disclosed IC will allow the motor to smoothly turn to zero speed and maintain up to the maximum torque without the need to constantly refresh the bootstrap capacitor.

In one aspect, an embodiment of an integrated gate driver for motor control is disclosed. The integrated gate driver includes a first diode having an anode coupled to an upper rail and a cathode coupled to provide a voltage on a first connector; a first power amplifier coupled between the first connector and a second connector, the second connector being coupled to a first pin for coupling to a source of a high-side power transistor, the first power amplifier being coupled to receive a first control signal and further coupled to provide an output signal to a second pin for driving a gate of the high-side power transistor; a first integrated capacitor coupled between the first connector and the second connector; and an integrated charge pump coupled to supply a current to the first connector, the integrated charge pump comprising a second integrated capacitor having a first terminal coupled to a high frequency oscillator and a second terminal coupled through a second diode to the first connector and a third diode having an anode coupled to the second connector and a cathode coupled to a point between the second capacitor and the second diode.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 1A:
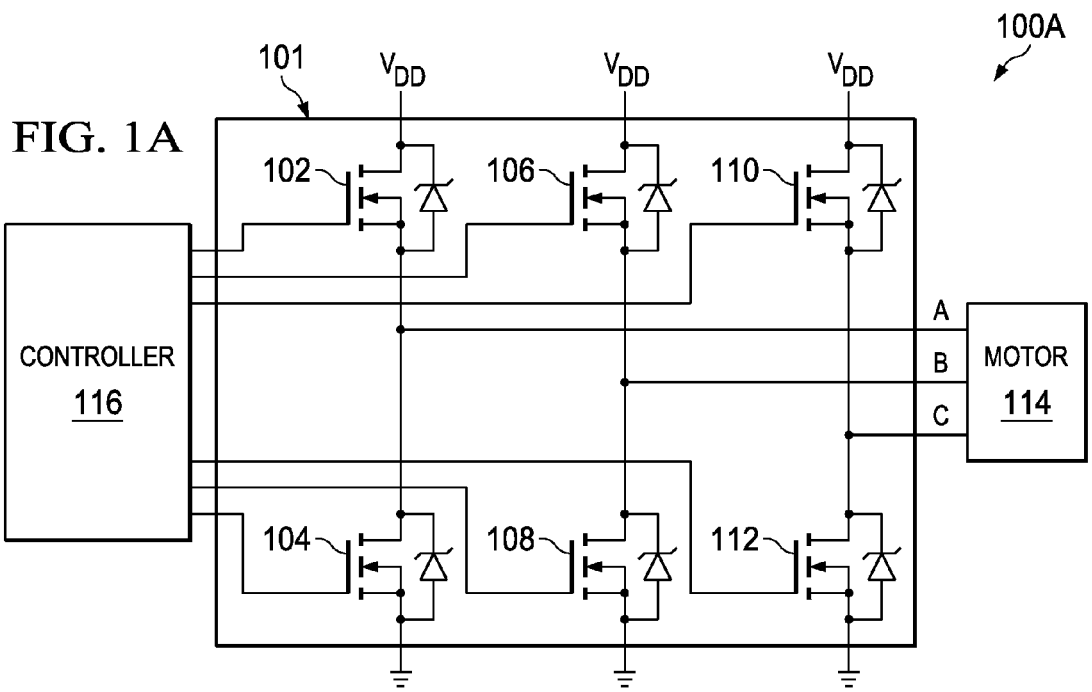
FIG. 1A depicts a simplified schematic diagram of an example motor control system for a three-phase motor.

Turning first to FIG. 1A, a simplified schematic diagram of a motor control system 100A for a three-phase motor is shown. Motor 114 is a three-phase motor with connections to receive control signals A, B and C to drive the three phases. Three-phase inverter circuit 101 includes power transistors 102, 104, 106, 108, 110, 112, which are coupled to provide the three control signals A, B, C. N-type metal oxide silicon (NMOS) power transistors 102 and 104 are coupled in series between the upper and lower high-voltage rails to provide control signal A, NMOS power transistors 106 and 108 are coupled in series between the high-voltage rails to provide control signal B, and NMOS power transistors 110 and 112 are coupled in series between the high-voltage rails to provide control signal C. Although the transistors in this example inverter are NMOS transistors, one skilled in the art will understand that insulated gate bipolar transistors (IGBTs) can also be used. NMOS transistors would generally be used for lower voltages, IGBTs would be generally be used for higher voltages. The gates of power transistors 102, 104, 106, 108, 110, 112 are controlled by controller 116, which operates the power transistors to drive the motor at a desired speed and direction in an efficient manner. The signals used to control the motor are discussed below in regard to FIG. 2. It will be understood that references herein to MOS transistors are not limited to transistors that utilize a metal gate, oxide dielectric and silicon body, but includes all variations of the original transistors that are commonly referred to as MOS transistors.

Figure 1B:
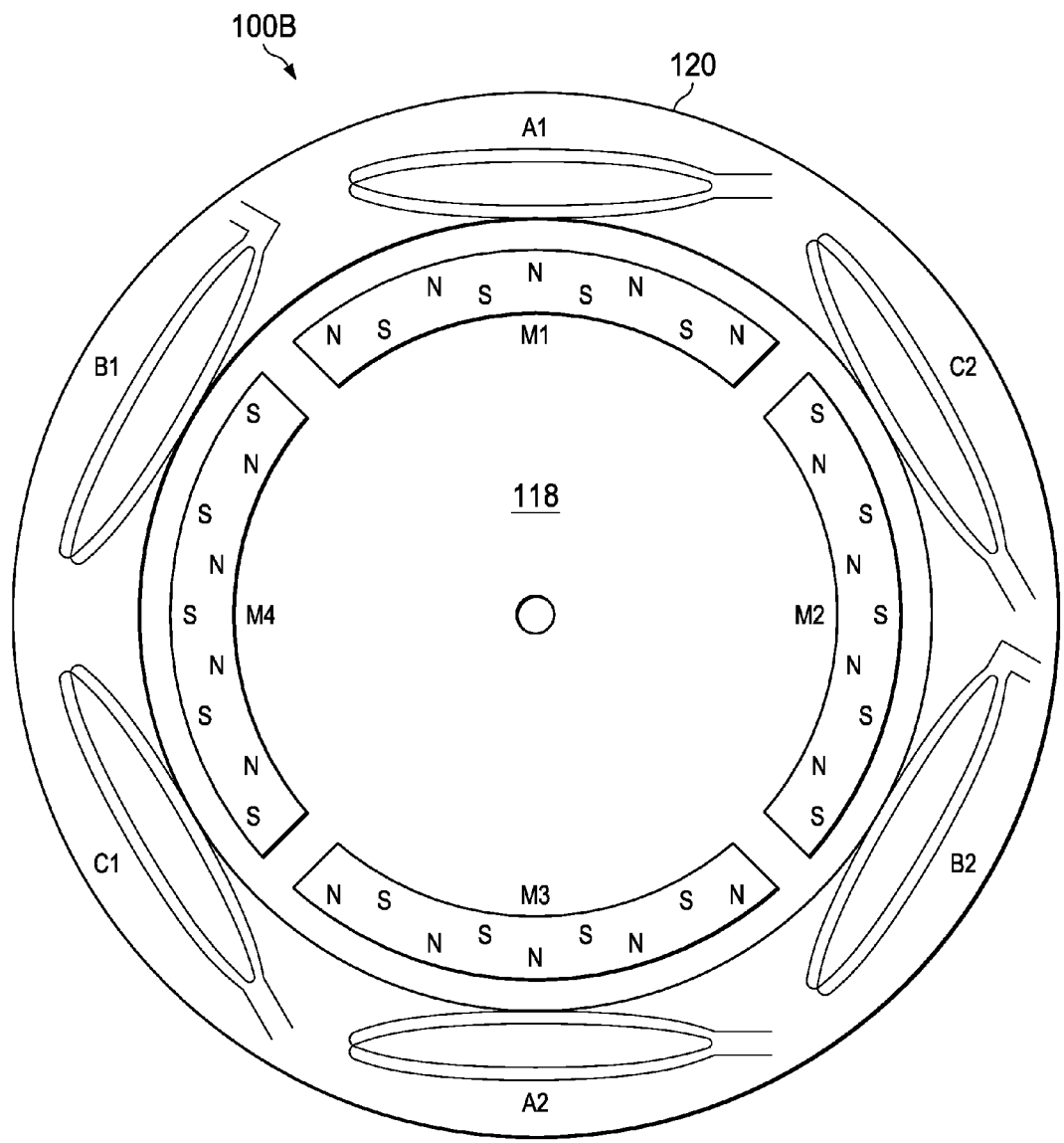
FIG. 1B depicts a simplified winding diagram of an example three-phase electric motor.

FIG. 1B depicts a simplified winding diagram of a 3-phase electric motor 100B, such as motor 114. An electric motor generally includes a stator, or stationary portion, and a rotor, or moving portion. Both the stator and rotor use magnets, either permanent or electromagnets, to act on each other. Although many different configurations are possible, in the embodiment shown, rotor 118 includes four permanent arc magnets M1, M2, M3, M4. Magnets M1 and M3 each present a north pole to the outside of the rotor and magnets M2 and M4 each present a south pole. In this same embodiment, windings A1, B1, C1, A2, B2, C2 are distributed about stator 120. When an electrical current is run through these winding, each acts as an electromagnet to attract or repel the magnets in the rotor. In a brushless electric motor, the windings are generally controlled in three phases by the signals A, B, C shown in FIG. 1A. Windings A1 and A2 have opposite windings from each other, so that they present opposite polarities to the rotor and are controlled by a phase A controller. Similarly, windings B1 and B2 have opposite windings from each other and are controlled by a phase B controller and windings C1 and C2 have opposite windings from each other and are controlled by a phase C controller. Although not specifically shown in FIG. 1A, a driver circuit receives feedback on the rotor position and excites appropriate windings to smoothly rotate the rotor in the desired direction and at the desired speed.

Figure 2:
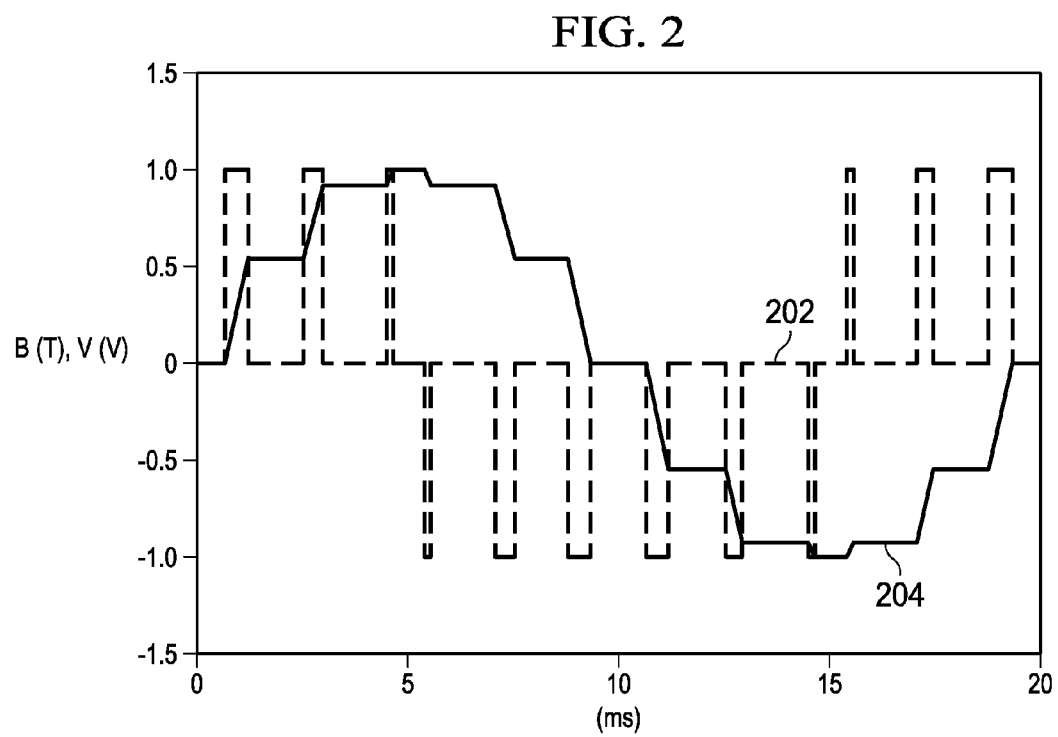
FIG. 2 depicts a pulse-width modulated voltage provided by a motor control transistor pair and the sinusoidal current seen at an inductor in the motor.

An example signal that can be provided by inverter 101 is shown in FIG. 2. Signal 202 can be produced by any of the transistor pairs shown in FIG. 1A and consists of a series of pulses. For this signal, the X-axis represents time in milliseconds and the Y-axis represents the voltage of the signal. All pulses have equal amplitudes, but may vary in sign and in length. Controller 116 modulates the length of pulses created by each pair of transistors, a process known as pulse width modulation.

When the voltage pulses of signal 202 are seen at any of the motors windings A1, B1, C1, A2, B2, C2, the inductor formed by the winding experiences the current represented by signal 204, i.e., the total voltage provided to the winding is integrated to provide a current that rises and falls in a roughly sinusoidal pattern as the pulses vary in length and sign. While the current shown is only roughly sinusoidal, it will be understood that as the clock frequency used to create these signals is increased, the current will more closely approach a sinusoidal shape. Numerous approaches can be used to control the switches of inverter 101, one of which is space vector modulation. Use of this technique can provide lower switching losses, but using this technique can create other problems as will be discussed below.

Figure 3:
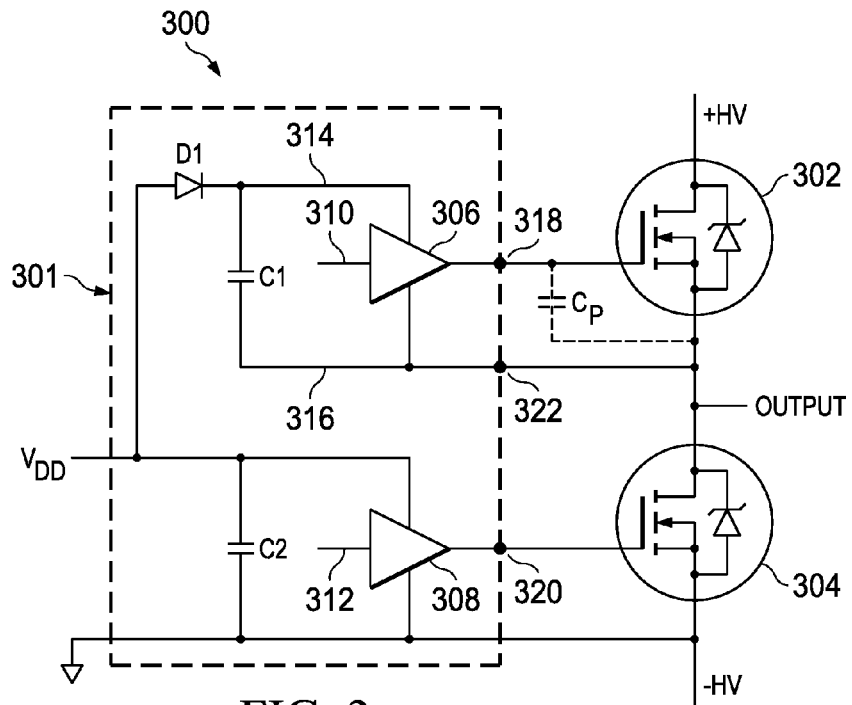
FIG. 3 depicts a gate driver circuit for motor control according to the prior art.

FIG. 3 illustrates a schematic circuit diagram of a portion of a motor control system 300 according to the prior art. Motor control system 300 includes NMOS power transistors 302, 304 and gate controller 301. Although only two power transistors are shown, it will be understood that in a motor control system for a three phase motor, power transistors 302, 304 would be one of three pairs of power transistors used to control the motor. As was seen in FIG. 1A, NMOS power transistors 302, 304 are coupled in series between high voltage rails, +HV, −HV, with an output taken between power transistors 302, 304.

In a typical industrial application, voltage levels can range from around 100-600 volts. For the sake of discussion, we can consider that the high voltage on power transistors 302, 304 is around 400 volts. Therefore, as transistors 302, 304 are alternately turned on and off by gate controller 301, the voltage at the output node alternates between zero and 400 volts. Gate controller circuit 301 is coupled to control the gates of power transistors 302 and 304 and is itself powered by $V_{DD}$, which is, for example 15 volts.

Within gate controller circuit 301, power amplifier 306 is coupled between connector 314, which is coupled to $V_{DD}$ through diode D1, and connector 316, which is coupled to pin 322; pin 322 is coupled to the output node. Power amplifier 306 receives control signal 310 from a controller (not specifically shown) and provides a gate control signal on pin 318, which in this figure is coupled to the gate of high-side power transistor 302. Similarly, power amplifier 308 is coupled between $V_{DD}$ and the lower rail. Power amplifier 308 receives control signal 312, which is the inverse of control signal 310, and provides a gate control signal on pin 320, which in this example is coupled to the gate of power transistor 304. Control signals 310, 312 are controlled such that only one of power transistors 302, 304 is on at one time.

Because the source of power transistor 302 is floating as power transistors 302, 304 are switched, the gate voltage supplied to pin 318 must also be able to float to a voltage that exceeds the output voltage by the amount necessary to charge parasitic capacitor $C_P$ and hold transistor 302 on. This is achieved in this circuit by bootstrap capacitor C1, which is connected between connector 314 and connector 316; additionally bootstrap capacitor C2 is connected between $V_{DD}$ and the lower rail.

Discussion of gate controller 301 will focus on the high-side controller, which presents challenges when controlling an NMOS power transistor. When signal 310 is low, amplifier 306 is off and does not supply any voltage to power transistor 302; at the same time, signal 312 is high and turns on amplifier 308, which turns on power transistor 304, so that the output node goes to a value of the lower power rail, e.g., zero. The lower terminal of capacitor C1 is pulled to the lower rail and the upper terminal of C1 charges to $V_{DD}$, which in one embodiment is 15 volts. When signal 310 goes high and signal 312 goes low, power transistor 302 turns on and power transistor 304 turns off and the output node starts to rise. To maintain power transistor 302 in the on state, the voltage at the gate of the power transistor must rise at the same rate as the rise at the output node, which is accomplished by capacitor C1. The previous charge of 15 volts on connector 314 cannot be pushed towards $V_{DD}$ because of the presence of diode D1, so as the voltage on pin 322 rises, the voltage is passed through capacitor C1 and the voltage on connector 314 rises also. Thus, if the output node rises to 400 volts, connector 314 rises from 15 volts to 415 volts and transistor 302 remains on.

It can be noted historically that an external charge pump can also be used instead of a bootstrap capacitor to provide the needed additional voltage. However, a charge pump requires a large capacitor in order to provide the current necessary to allow power amplifier 306 to charge the parasitic gate capacitor, necessitating an external capacitor for the charge pump. Accordingly, current generators are not generally used in circuits for motor control.

While bootstrap capacitor C1 solves the problem of allowing the gate voltage to rise with the source voltage, another issue remains. During a time period when transistor 302 is held on, quiescent current $I_Q$ is necessary in order to provide power to power amplifier 306. While the size of $I_Q$ can be small, this current nevertheless draws down the voltage on connector 314; when this voltage falls too low, it is no longer possible for power amplifier 306 to operate and power transistor 302 is turned off. Connector 314 cannot be recharged in this circuit until control signal 310 again goes low and the output node again goes to zero. The amount of time that the high-side driver circuit can be held in the ON position depends on factors such as the size of capacitor C1, the size of parasitic capacitor $C_P$, and the quiescent current $I_Q$. However, once this limit is reached, the transistor pair 302, 304 must be switched in order to allow capacitor C1 to charge. While in motor control, it is possible to design the switching of the inverter formed by power transistors 302, 304 such that power transistor 302 is switched off often enough to allow the recharging of connector 314, it would be desirable to allow longer periods when power transistor 302 can be held on.

Situations when it is desirable for one of the motor control signals to remain high for a longer period can include the use of space vector modulation, operation of a motorized tool in slow motion, and the need to hold a motor in a fixed position, e.g., when an electric vehicle is stopped on a hill. Thus, while the circuit illustrated in FIG. 3 provides a simple solution that is good for switching mode power supplies, it requires a high-side driver that has a low quiescent current. Additionally, this circuit limits the length of PWM signals and limits low speed operation and zero speed torque that can be applied to the motor. The circuit also requires a start-up sequence and advanced control algorithms.

Figure 4:
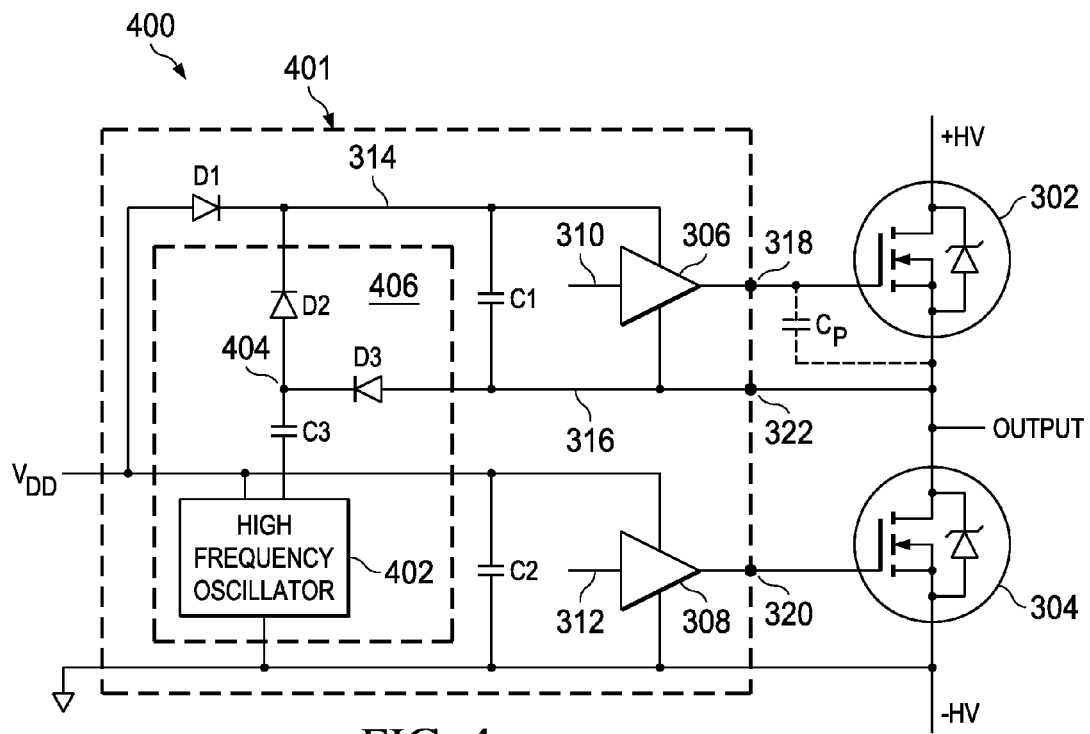
FIG. 4 depicts a schematic diagram of an integrated gate driver for motor control according to an embodiment of the disclosure.

FIG. 4 illustrates a schematic circuit diagram of an improved motor control system 400 according to an embodiment of the disclosure. In gate controller 401, all elements are integrated on a single chip. As in the previous figure, diode D1 allows current to flow from $V_{DD}$ to connector 314 to supply a voltage to power amplifier 306 and charge integrated bootstrap capacitor C1 whenever the output node is low. Integrated capacitor C1 passes a voltage rise on the output node through to raise the voltage on connector 314, maintaining the gate/source voltage necessary to turn on transistor 302. Several additional elements are added to the high-side driver circuit, namely high frequency oscillator 402, which is coupled between $V_{DD}$ and the lower rail, integrated capacitor C3 and diodes D2 and D3. Capacitor C3 has a first terminal coupled to high frequency oscillator 402 and a second terminal coupled to the anode of diode D2; the cathode of diode D2 is coupled to connector 314. Diode D3 has an anode coupled to connector 316 and a cathode coupled between capacitor C3 and diode D2.

Although connector 316 and therefore node 404 will alternate between the high voltage rails, DC current will not be passed through capacitor C3. However, the AC current produced by high frequency oscillator 402 will pass through capacitor C3. Thus, high frequency oscillator 402, capacitor C3, and diodes D2 and D3 operate as a charge pump 406 to provide a small current to connector 314. In one embodiment, capacitor C3 is sized so that the charge provided through this capacitor is enough to supply the high side quiescent current, $I_Q$. Since it is possible to design $I_Q$ to be a very small value, it is not necessary for C3 to be a large capacitor. In one embodiment, $I_Q$ is in the range of one to ten microamps. The current necessary to charge parasitic capacitor $C_P$, on the other hand, can be in the range of one amp. From this comparison, it can be seen that although charge pumps are seldom used by themselves in circuits for motor control, by combining integrated charge pump 406 with integrated bootstrap capacitor C1, which supplies the charge necessary to charge parasitic capacitor Cp, power amplifier 306 can be powered indefinitely to hold high-side power transistor 302 on. This allows a single IC solution that is good for motor control, with no external components required. Additionally, this circuit allows PWM signals to have unlimited lengths, imposes no limits on low speed, and allows for simple control algorithms. Additionally, although the disclosed embodiments include a charge pump that only supplies quiescent current for power amplifier 306 while bootstrap capacitor C1 supplies the current to charge the parasitic capacitance, the size of components in the combination can be adjusted to optimize elements such as cost and space occupied, allowing flexibility of design. By having all components integrated into the chip, the disclosed embodiment also reduces the number of external pins required, provides greater reliability and reduces the intricacy of layouts when multiple chips are combined into a system.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. An integrated gate driver for motor control comprising:
   a first diode having an anode coupled to a first voltage and a cathode coupled a first connector;
   a first power amplifier coupled between the first connector and a second connector, the second connector coupled to a first pin, the first pin coupled to a source of a high-side power transistor, the first power amplifier being coupled to receive a first control signal and further coupled to a second pin, the second pin coupled to a gate of the high-side power transistor;
   an integrated first capacitor coupled between the first connector and the second connector;
   an integrated charge pump coupled the first connector, the integrated charge pump comprising a second integrated capacitor having a first terminal coupled to a high frequency oscillator and a second terminal coupled through a second diode to the first connector and a third diode having an anode coupled to the second connector and a cathode coupled to the second terminal of the second integrated capacitor.

2. The integrated gate driver for motor control as recited in claim 1 further comprising:
   a second power amplifier coupled between the first voltage and a second voltage, the second power amplifier coupled to a second control signal that is the binary logical opposite of the first control signal and further coupled to a third pin, the third pin coupled to a gate of a low-side power transistor;

a third capacitor coupled between the first voltage and the second voltage.

3. The integrated gate driver for motor control as recited in claim 2 wherein the charge pump provides a current in the range of one to ten microamps.

4. The integrated gate driver for motor control as recited in claim 1 wherein the integrated gate driver is integrated on a single integrated circuit.

5. The integrated gate driver for motor control as recited in claim 1 wherein in the first power amplifier can be indefinitely powered to keep the high-side power transistor turned on.

* * * * *